United States Patent
Stathatos et al.

(10) Patent No.: US 12,080,818 B2
(45) Date of Patent: Sep. 3, 2024

(54) PHOTOVOLTAIC GLASS PANE AND METHOD OF PRODUCING A PHOTOVOLTAIC GLASS PANE

(71) Applicant: Brite Hellas AE, Salonika (GR)

(72) Inventors: Ilias Stathatos, Patras (GR); Nikolaos Kanopoulos, Salonika (GR); Theodoros Makris, Patras (GR); Ioannis Katsagounos, Kirras Fokidas (GR); Panagiotis Giannopoulos, Patras (GR); Georgios Tselepidis, Edessa (GR)

(73) Assignee: BRITE HELLAS AE, Salonika (GR)

( * ) Notice: Subject to any disclaimer, the term of this patent is extended or adjusted under 35 U.S.C. 154(b) by 0 days.

(21) Appl. No.: 17/510,613

(22) Filed: Oct. 26, 2021

(65) Prior Publication Data

US 2022/0278244 A1    Sep. 1, 2022

(30) Foreign Application Priority Data

Feb. 26, 2021 (NL) ........................ 2027662
Sep. 28, 2021 (EP) ....................... 21199432

(51) Int. Cl.
H02S 40/20 (2014.01)
H01L 31/048 (2014.01)
H01L 31/054 (2014.01)
H01L 31/18 (2006.01)

(52) U.S. Cl.
CPC ........ H01L 31/0488 (2013.01); H01L 31/054 (2014.12); H01L 31/18 (2013.01); H02S 40/20 (2014.12)

(58) Field of Classification Search
CPC . H01L 31/055; H01L 31/048; H01L 31/0488; H01L 31/18; H01L 31/054; H02S 40/20
See application file for complete search history.

(56) References Cited

U.S. PATENT DOCUMENTS

| | | | | |
|---|---|---|---|---|
| 2004/0266908 | A1* | 12/2004 | Marguerettaz | C09D 11/322 523/160 |
| 2006/0093732 | A1* | 5/2006 | Schut | C23C 18/2086 427/58 |
| 2010/0012183 | A1 | 1/2010 | Yeh | |
| 2012/0247536 | A1* | 10/2012 | Kawai | B82Y 30/00 977/948 |

(Continued)

FOREIGN PATENT DOCUMENTS

| | | |
|---|---|---|
| CN | 201773856 U | 3/2011 |
| CN | 112382684 A | 2/2021 |

*Primary Examiner* — Uyen M Tran
(74) *Attorney, Agent, or Firm* — KDW Firm PLLC

(57) ABSTRACT

A photovoltaic glass pane includes a glass panel, and one or more photovoltaic cells arranged on or in the glass panel. Each of the one or more photovoltaic cells has a light receiving surface to be exposed to light from a light source and being comprised of a semiconducting material having a spectral response to the light. A spectral conversion layer is arranged between the light receiving surface and the light source and is configured to convert photons from the light source of a first energy into photons of a second energy. The spectral response to the photons of the second energy is higher than the spectral response to the photons of the first energy.

5 Claims, 9 Drawing Sheets

(56) References Cited

U.S. PATENT DOCUMENTS

| | | | | |
|---|---|---|---|---|
| 2013/0037084 A1* | 2/2013 | Chidambaram | ..... | H01L 31/0481 |
| | | | | 136/247 |
| 2013/0340808 A1* | 12/2013 | Komatsu | ............... | H01L 31/055 |
| | | | | 136/247 |
| 2015/0003040 A1 | 1/2015 | Bessho et al. | | |

* cited by examiner

PHOTOVOLTAIC GLASS PANE AND METHOD OF PRODUCING A PHOTOVOLTAIC GLASS PANE

CROSS-REFERENCE TO RELATED APPLICATIONS

This is a US non-provisional of pending European Patent Application serial no. EP21199432, filed Sep. 28, 2021, which claims priority to pending Netherlands Patent Application serial no. NL 2027662, filed Feb. 26, 2021, the entirety of which applications are incorporated by reference herein.

FIELD

The present invention relates to a photovoltaic glass pane. Furthermore, the present invention relates to a method of producing a photovoltaic glass pane.

BACKGROUND INFORMATION

Solar panels are well-known-for capturing solar energy and converting the energy into electrical power. At present, solar panels can convert the visible light portion (400 nm-700 nm) of the incident light into electrical power and have a conversion efficiency of 15%-20%. Solar modules composed of crystalline or amorphous silicon are wide spread for electricity generation exhibiting enhanced performance and stability over the years. Typically, a series of silicon wafers are soldered together with electrical flat wires to form a solar panel which are encapsulated on the back side by thermoplastic polymer material such as EVA, PVB etc. The bus wires that exit the module are electrically connected to a junction box at the back side of the solar panel. The solar cells are laminated to encapsulate layer/layers to be protected from environmental changes, humidity and corrosion. In principle, a solar module is accomplished by a front glass made light receiving side, the solar cells with interconnection wires which are in close contact with glass pane and the back non-light receiving side with the encapsulant layer and junction box(es).

Although the efficiency of the crystalline silicon based solar modules is high among many technologies, even more efficient solar modules are highly desired in combination with possible transparency for specific applications which is almost negligible in current photovoltaic modules. Silicon crystalline panels with special dyes have been proposed for improved performance of the solar cells, but this configuration absorbs specific wavelengths in the visible which may not be desired in several applications.

SUMMARY

The present invention relates to the use of nano-coatings that absorb UV part of solar radiation and emit light in the visible region as co-sensitizers to solar cells is an inspired structure for enhanced performance of the PV module. In the case that the solar cells partially cover the glass and a part of the glass is free of solar cells could give transparency to the solar panel. The combination of UV absorbing and visible emitting nano-coatings with transparent solar modules could give extra light for solar cells and also enhanced PAR radiation.

The present invention further relates to solar modules and in particular, backcoatings and related materials for solar modules. Specifically, it relates to semitransparent crystalline silicon solar modules and their modification with new nano-coatings for spectral shift from UV region to the Visible region of solar light for solar cell enhanced performance and PAR (Photosynthetically Active Radiation) increment. The nano-coating is based on a single layer or monolayer film that is composed primarily of an organic/inorganic compound. The nano-coating may contain one or two optional films deposited by inkjet printed method or any other deposition method on the backside of glass hosts the solar cells and in contact with them. There can be other variation, modification and alternatives to the structure aiming the best performance of the solar module.

Specifically, the present invention provides according to a first aspect thereof a photovoltaic glass pane, comprising a glass panel, one or more photovoltaic cells arranged on or in the glass panel, each of the one or more photovoltaic cells having a light receiving surface to be exposed to light from a light source and being comprised of a semiconducting material having a spectral response to the light, and a spectral conversion layer arranged between the light receiving surface and the light source and configured to convert photons from the light source of a first energy into photons of a second energy, wherein the spectral response to the photons of the second energy is higher than the spectral response to the photons of the first energy.

In a preferred embodiment of the photovoltaic glass pane, the spectral conversion layer is a luminescent down-shifting layer configured to convert the photons of the first energy into the photons of the second energy, wherein the first energy is higher than the second energy.

In a preferred embodiment, the photons of the first energy are photons having wavelengths in the UV part of the light spectrum and wherein the photons of the second energy are photons having wavelengths in the visible part of the light spectrum.

In a preferred embodiment, the luminescent down-shifting layer is made of a material comprising a compound of one or more rare earth elements.

In a preferred embodiment, the one or more rare earth elements comprise Europium or Samarium, and wherein the photons of the second energy are red light photons.

In a preferred embodiment, the one or more rare earth elements comprise Terbium, and wherein the photons of the second energy are green light photons.

In a preferred embodiment, the luminescent down-shifting layer is made of a material comprising organic molecules or polymeric materials based on aromatic compounds, and wherein the photons of the second energy are blue light photons.

In a preferred embodiment, the spectral conversion layer is arranged on top of the light receiving surface of each of the one or more photovoltaic cells and/or a surface of the glass panel between the light receiving surface and the light source.

In a preferred embodiment, the spectral conversion layer is arranged between the light receiving surface and the glass panel.

In a preferred embodiment, the spectral conversion layer is arranged on top of a light receiving surface of the glass panel that faces the light source.

In a preferred embodiment, the spectral conversion layer is arranged across the whole surface of the glass panel.

In a preferred embodiment, the spectral conversion layer is a nano-coating.

Preferably, the one or more photovoltaic cells cover only a portion of the surface area of the glass pane, so that another portion of the glass pane is transparent to the light from the light source, at least the visible thereof.

According to a second aspect, the present invention provides a method of manufacturing a photovoltaic glass pane, comprising providing a glass panel, arranging one or more photovoltaic cells on or in the glass panel, each of the one or more photovoltaic cells having a light receiving surface to be exposed to light from a light source and being comprised of a semiconducting material having a spectral response to the light, and arranging a spectral conversion layer between the light receiving surface and the light source which is configured to convert photons from the light source of a first energy into photons of a second energy, wherein the spectral response to the photons of the second energy is higher than the spectral response to the photons of the first energy.

In a preferred embodiment of the method, the spectral conversion layer is a nano-coating and wherein the step of arranging the spectral conversion layer between the light receiving surface and the light source comprises printing the nano-coating on the light receiving surface and/or a surface of the glass panel between the light receiving surface and the light source.

In a preferred embodiment, the nano-coating is printed such that it is arranged between the light receiving surface and the glass panel.

In a preferred embodiment, the nano-coating is printed on top of a light receiving surface of the glass panel that faces the light source.

In a preferred embodiment, the nano-coating is printed across the whole surface of the glass panel.

In a preferred embodiment, the step of printing the nano-coating comprises inkjet printing the nano-coating.

In a preferred embodiment, the spectral conversion layer is a luminescent down-shifting layer configured to convert the photons of the first energy into the photons of the second energy, wherein the first energy is higher than the second energy.

In a preferred embodiment, the photons of the first energy are photons having wavelengths in the UV part of the light spectrum and wherein the photons of the second energy are photons having wavelengths in the visible part of the light spectrum.

In a preferred embodiment, the luminescent down-shifting layer is made of a material comprising a compound of one or more rare earth elements.

In a preferred embodiment, the one or more rare earth elements comprise Europium or Samarium, and wherein the photons of the second energy are red light photons.

In a preferred embodiment, the one or more rare earth elements comprise Terbium, and wherein the photons of the second energy are green light photons.

In a preferred embodiment, the luminescent down-shifting layer is made of a material comprising organic molecules or polymeric materials based on aromatic compounds, and wherein the photons of the second energy are blue light photons.

The present invention allows for UV to visible light spectrum shift using nano-coatings applied with inkjet printing or any other related printing technique on the backside of the glass that holds the solar cells in a solar module and in contact with them. The present invention enables increasing the efficiency of all commercialized and also emerging photovoltaic (PV) technologies by giving them the ability to effectively harvest more wavelengths of light available in the solar spectrum and the production of transparent solar glass utilizing this increased efficiency. Specifically, for better solar light utilization spectral converters are used to absorb solar photons that cannot be effectively captured and convert them to wavelengths more suitable for conversion, by overcoming the non-absorption and thermalization losses in the above crystalline silicon PV technology which has been a bottleneck limiting their efficiency. For example, in single-junction crystalline silicon (c-Si) PV cells, the Shockley-Queisser limit shows that the conversion efficiency is placed at around 30%. The photo generation of charge carriers only occurs if the device absorbs solar photons with energies equal or larger to that of the bandgap energy ($E_G$). All photons of energy less than $E_G$ falling on the PV cell are transmitted through the device and are finally lost. Furthermore, the absorption of photons greater than $E_G$ is also inefficient, since the excess energy gained is lost as heat through non-radiative recombination of the photo-excited charge carriers. Intrinsic spectral losses thus represent a major efficiency fall in PV cells. For that reason, the overall performance of single-junction crystalline silicon (c-Si) PV cells is increased by the present invention which extends the solar light utilization.

Preferably, the method according to the present allows for the production of solar glass panels utilizing spectral converters to absorb solar photons that cannot be effectively captured and convert them to wavelengths more suitable for conversion to electricity.

Preferably, the method according to the present allows for the production of solar glass panels can be in different sizes and shapes depending on the needs of each application.

Preferably, the method according to the present allows for the production of solar glass panels with different levels of transparency and power output using a different number of embedded solar cells depending on the needs of each application.

Preferably, the method according to the present allows for the production of solar glass panels with a single junction box or two junction boxes (positive and negative) for installation flexibility depending on the needs of each application.

Preferably, the method according to the present allows for the application of nano-coatings as spectral converters on the existing solar panels to the interior side of the glass and in contact with solar cells.

BRIEF DESCRIPTION OF THE DRAWINGS

By reference to the appended drawings, which illustrate exemplary embodiments of the present invention according to aspects thereof, the detailed description provided below explains in detail various features, advantages and aspects of this invention. As such, features of this invention can be more clearly understood from the following detailed description considered in conjunction with the following drawings. Each exemplary aspect or embodiment illustrated in the drawings is not intended to be to scale, to be comprehensive of all aspects, or to be limiting of the invention's scope, for the invention may admit to other equally effective embodiments and aspects.

As such, the drawings are included to provide a further understanding and are incorporated in and constitute a part of this specification, wherein.

DETAILED DESCRIPTION

Before any embodiments of the present disclosure are explained in detail, it is to be understood that the disclosure is not limited in its application to the details of the construction and the arrangement of components set to the following description. Any numerical range recited hereafter is intended to include and to specifically disclose the end points specified and also integers and fractions within that range.

Figure 1A:
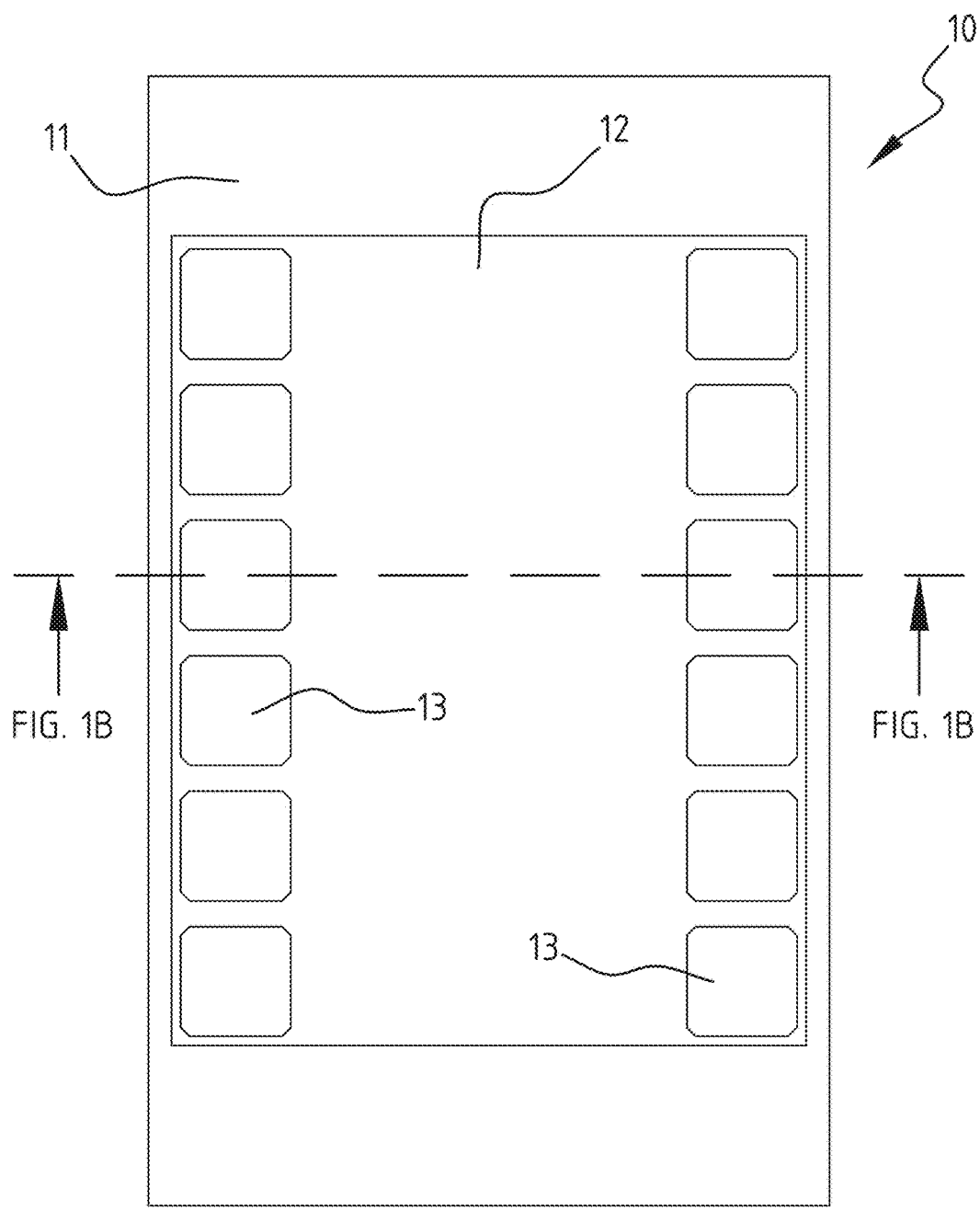
FIG. 1A shows a top view of a schematic representation a solar/photovoltaic glass pane comprising multiple solar cells connected in series.
Figure 1B:
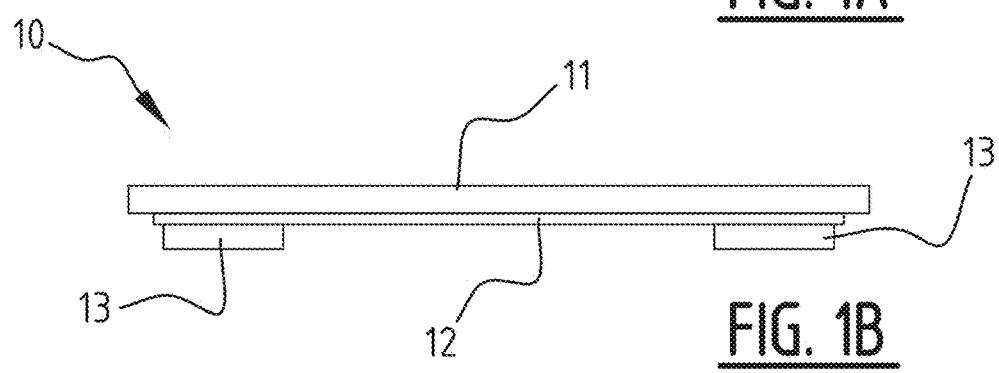
FIG. 1B shows a side view of a cross section of the schematic representation of FIG. 1A according to the dashed line as shown in FIG. 1A.

The present invention relates to inkjet printed solar spectral converters on solar glasses of different size, transparency level and power output. The present invention will be described in reference to the drawings in which exemplary embodiments of the invention are shown. In FIG. 1A, a top view of a schematic representation of a semitransparent solar glass 10 with inkjet printed solar spectral converters in the form of a spectral conversion layer 12 is presented. In particular, the PV glass 10 is made according to existing solar cell technology with an additional layer of spectral converters 12 made with inkjet printable materials succeeding higher efficiency in the visible region of the light. The solar glass 10 comprises 12 individual solar cells 13 in series interconnected depending on the size of the glass 11, the target transparency and power output. The distance between the individual cells 13 can be also varied depending on the desired visual effect. The transmittance of the solar glasses can be varied in terms of the number of solar cells used and is inversely proportional to the final power output.

Figure 2:
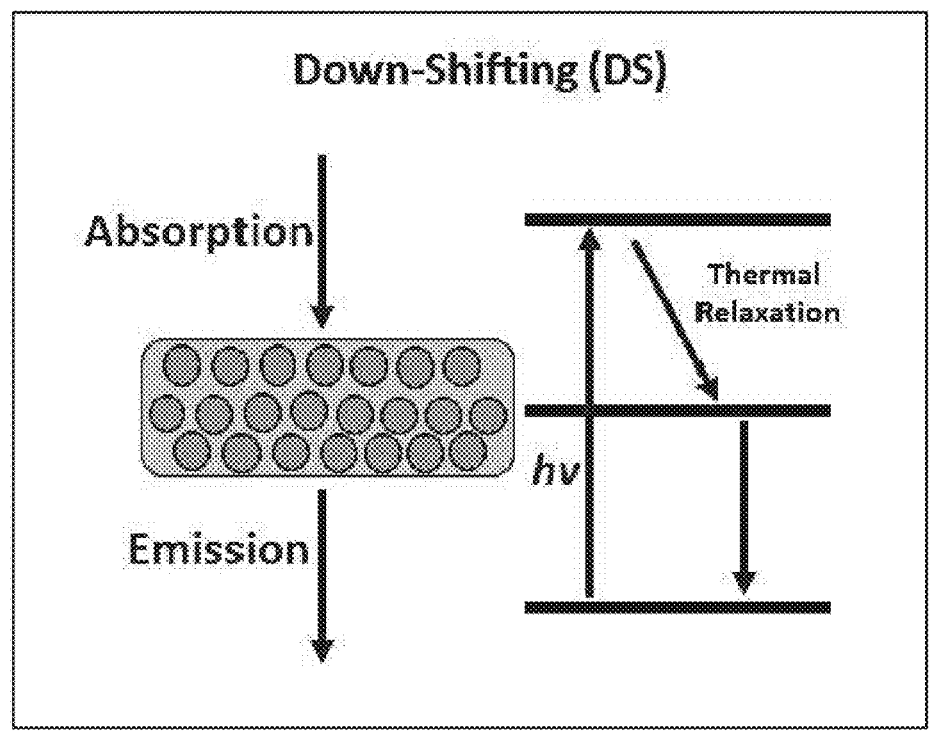
FIG. 2 shows photoluminescence processes employed in spectral converter and a simplified energy level diagram for a down-shifting (DS) compound.

For better solar light utilization, spectral converters are used to absorb solar photons that cannot be effectively captured and convert them to wavelengths more suitable for conversion, by overcoming the non-absorption and thermalization losses in the above crystalline silicon PV technology. Since (c-Si) PV have relatively strong absorption in the middle wavelength region in comparison to UV-blue shortwave length region of visible irradiation, luminescence down-shifting (DS), which converts the higher energy photons that cannot be sufficiently utilized into lower energy photons that can be well used for photocurrent generation, is an interesting route to improve the UV-blue response (FIG. 2). Using a luminescent down-shifting layer facing the light receiving side of the individual solar cells 13 of solar/photovoltaic glass pane 10 which is only partially covered by the cells, allows for increasing the efficiency of the solar cells 13, while at the same time increasing the amount of photosynthetically active radiation (PAR) emitted from the surface of the glass pane 10 that faces away from the light source.

Figures 3A, 3B:
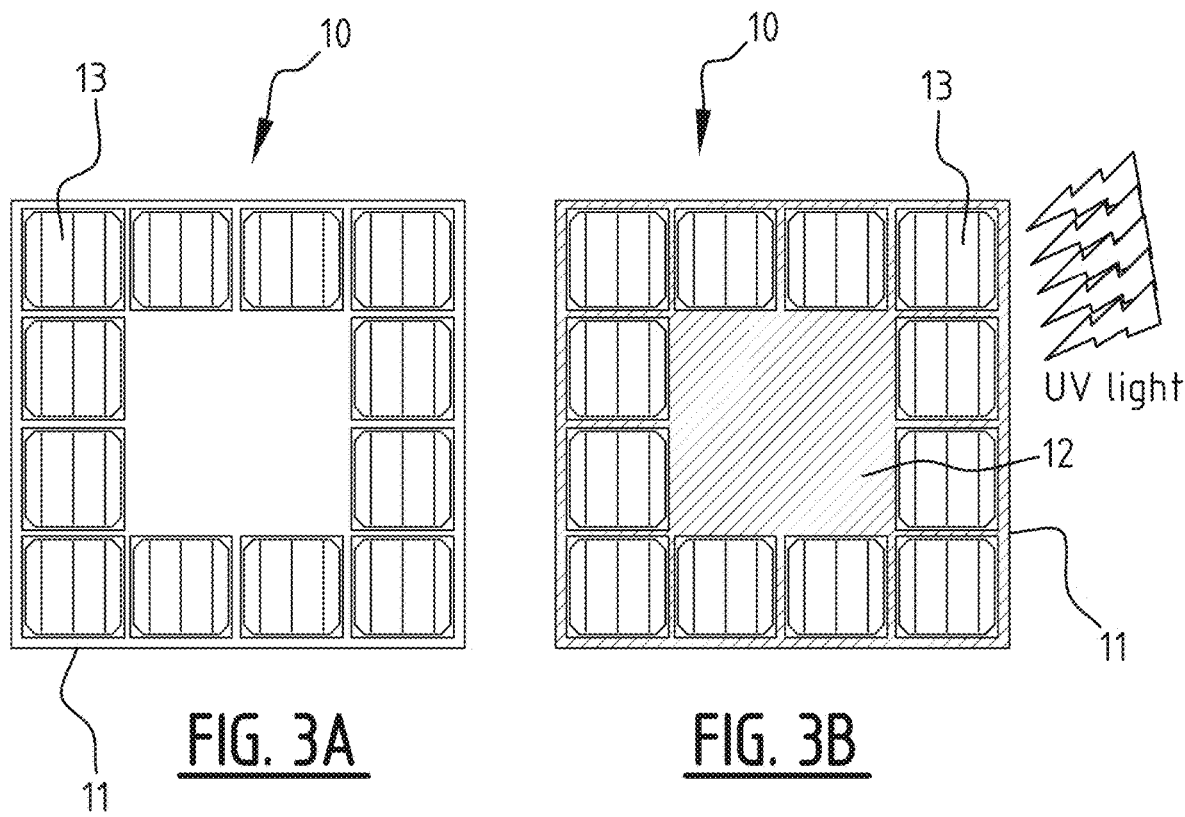
FIGS. 3A and 3B show a c-Si PV panel without (FIG. 3A) and with (FIG. 3B) a down-shifting luminescent compound nano-coating, respectively.

To illustrate this concept, FIG. 3A shows a solar glass pane 10 with crystalline silicon PV cells 13 without a down-shifting luminescent compound nano-coating, while FIG. 3B shows a solar glass pane 10 with crystalline silicon PV cells 13 with a down-shifting luminescent compound nano-coating layer 12 applied across the whole surface of the glass 11 and in front of the solar cells 13 as seen in the direction of the incoming light. The down-shifting luminescent compound nano-coating layer 12 converts UV light into one of visible red, green or blue light, which is indicated by the shading in FIG. 3B.

The application of these DS compounds could be by dispersing or inkjet-printing luminescent species, such as rare earth element luminophores, in a completely transparent (in the visible range of light) matrix and applying them in a first embodiment in front of the (c-Si) PV themselves or in a second embodiment to the glass that keeps the PVs in the panel. DS integration does not need any adjustment in device architecture or output electrical circuit for given (c-Si) PV. The DS integration for (c-Si) PV preferably satisfies the essential requirement that the luminescent species have high photoluminescence quantum yield but little absorption overlap in the response region of PV materials.

Figure 4A:
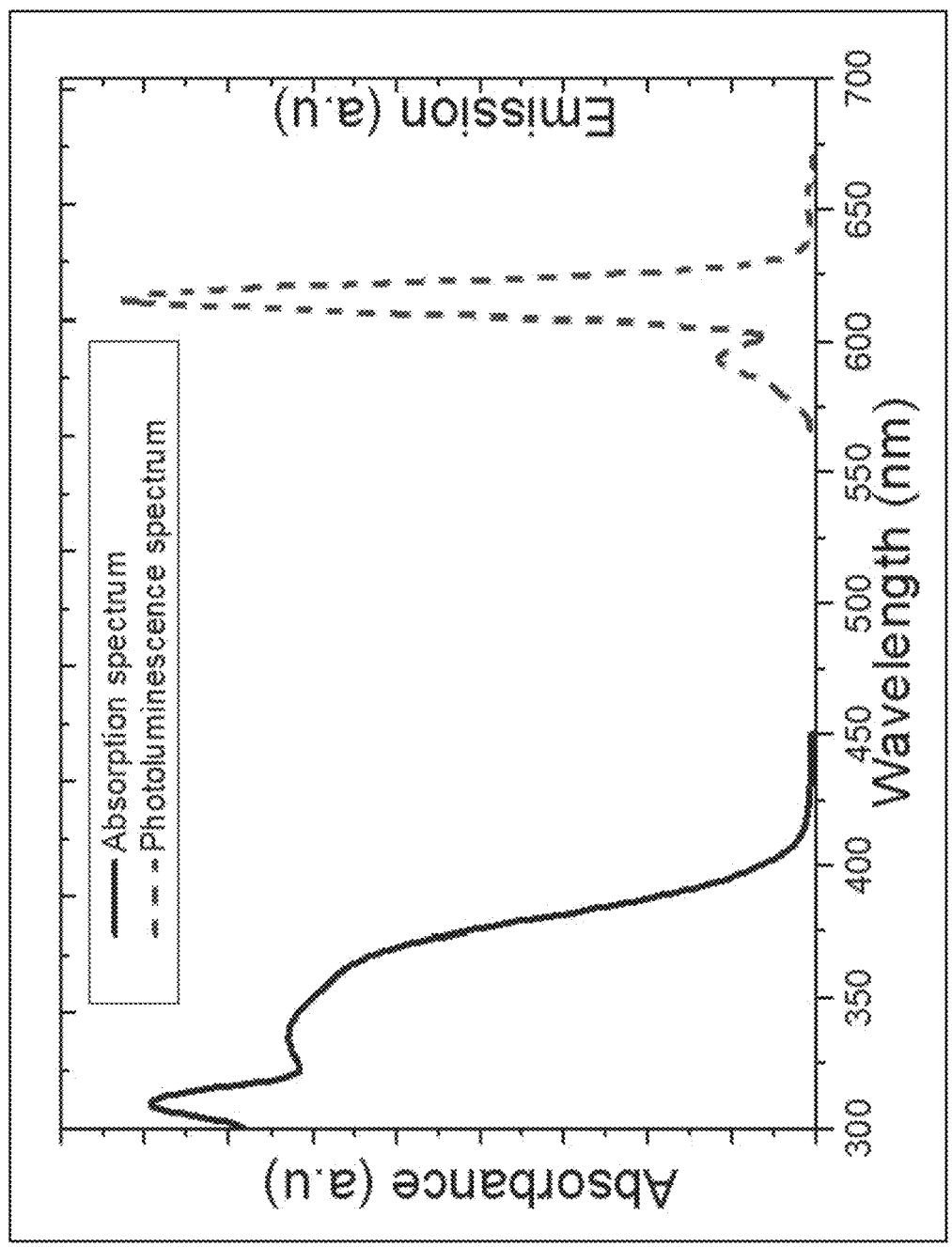
FIGS. 4A, 4C and 4D show absorption and emission spectra of nano-coatings based on red (FIG. 4A), green (FIG. 4B) and blue (FIG. 4D) emitting compounds, respectively.
Figure 4B:
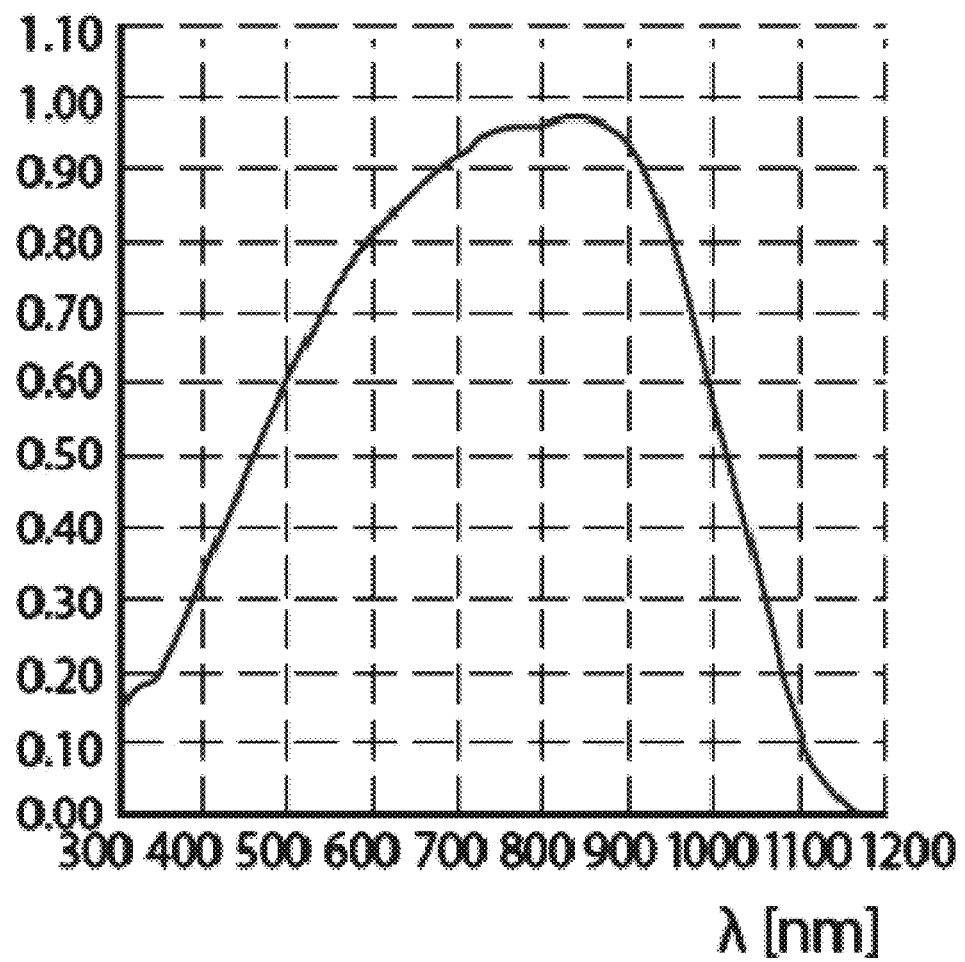
FIG. 4B shows the relative spectral response of c-Si PV.

In the following, three examples of materials are presented that are used as light concentrators in the visible by selective absorption in the UV region. In particular, as a first embodiment, two rare earth based compounds with selective emission in the visible (in red for Europium and in green for Terbium based compounds) are used to cover the glass pane that hosts the silicon photovoltaic cells in the inner side of the glass and in contact with the solar cells. The low spectral response of silicon PV in the UV region (see FIG. 4B) in relation to the absorption spectra of both compounds in UV avoids any shading effect to the solar cell while there is promotion to the visible light utilization by the strong emission of these compounds. A third example is presented, in the case that selective emission in the blue region of the visible spectrum is desirable. In this embodiment small organic molecules or polymeric materials based on aromatic compounds are used.

Figure 4C:
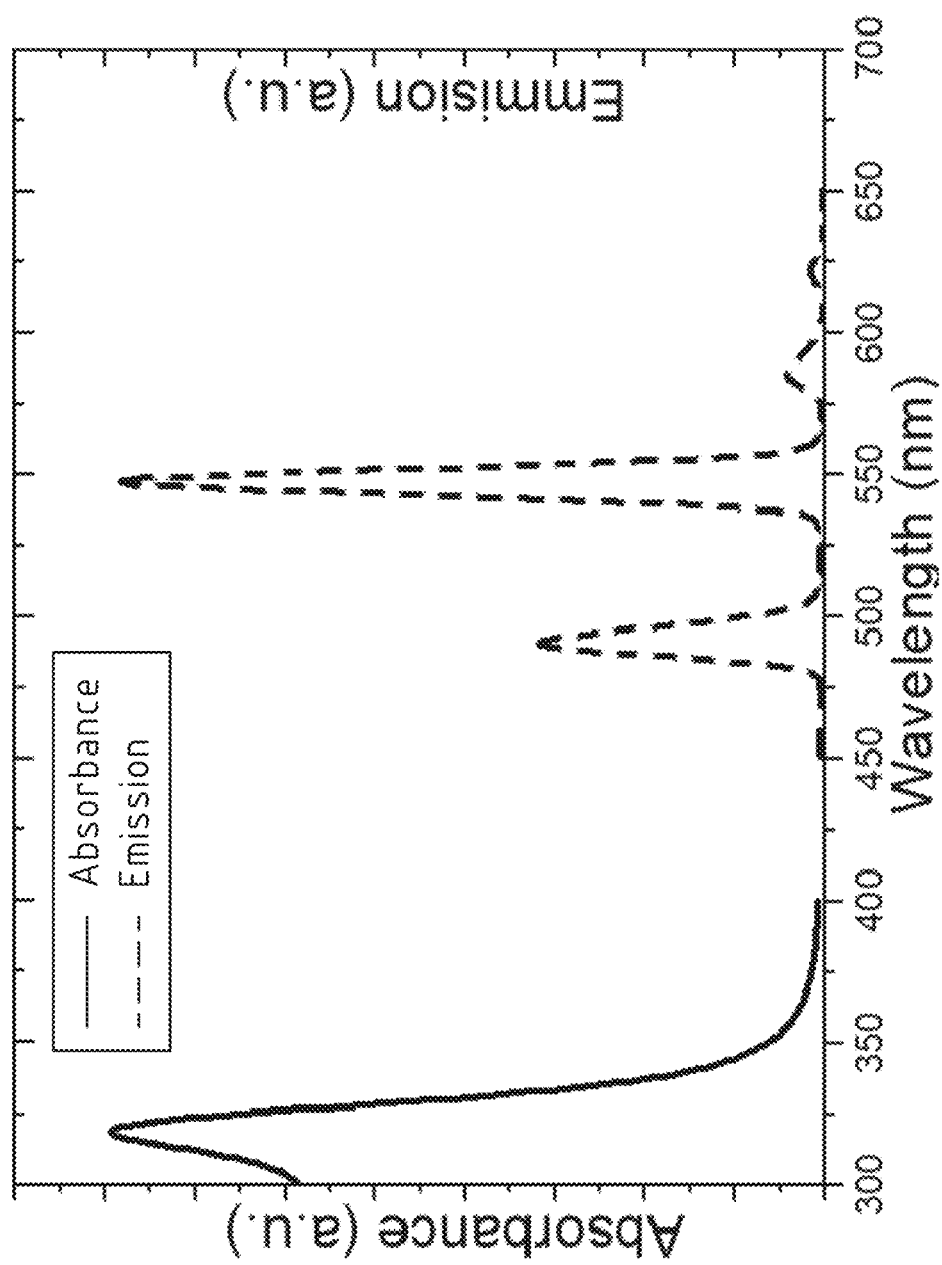
Figure 4D:
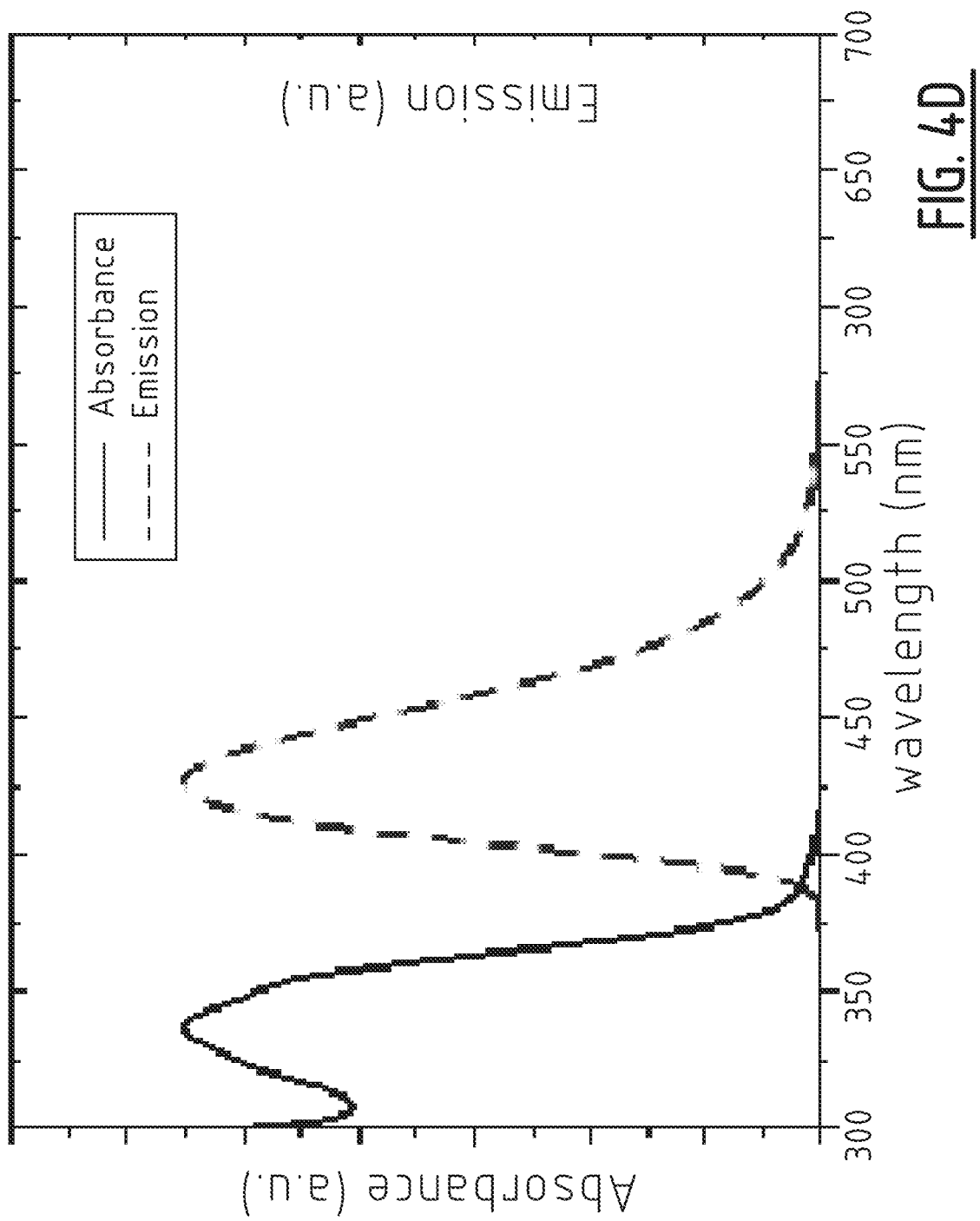
Figure 5:
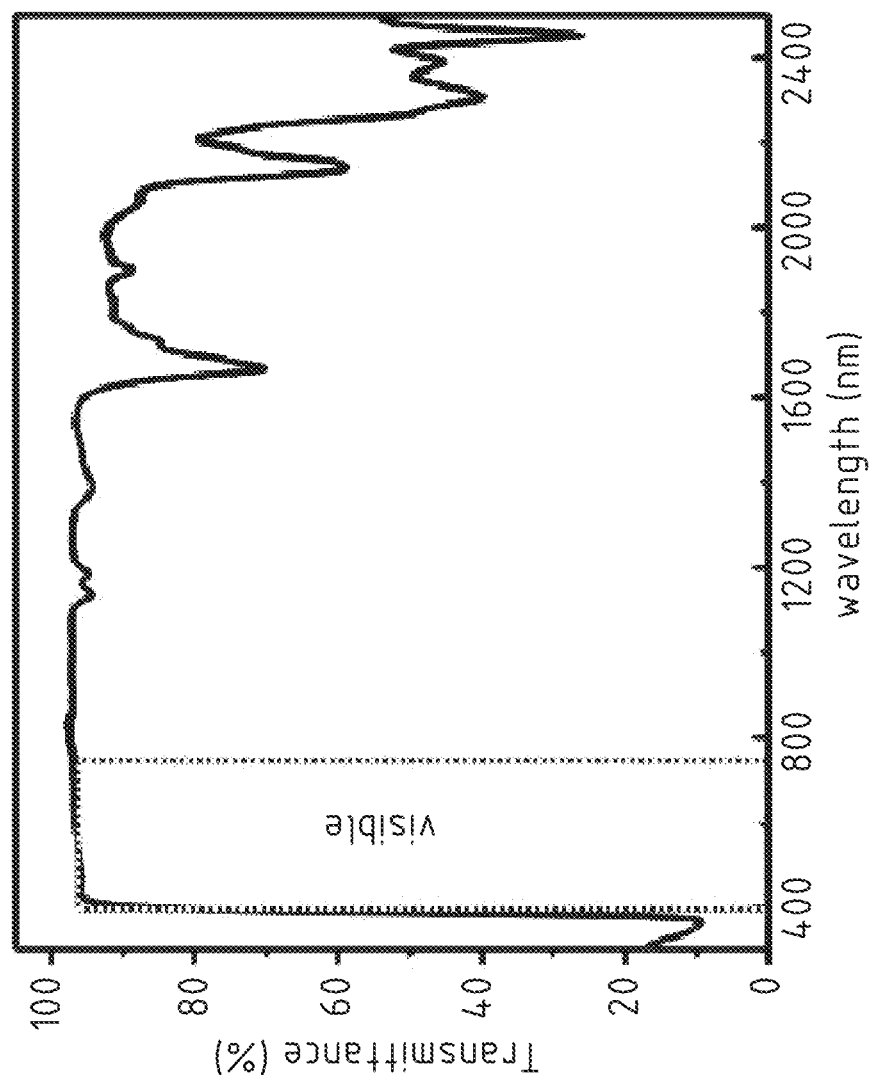
FIG. 5 shows the transmittance of the uncovered part of solar panel with solar cells in the presence of luminescent downshifting material.

Usually the materials cover this application as light concentrators have to exhibit high transmittance and suitable refractive index (n=1.4-2.4) to prevent scattering and absorption, especially in the spectral region where the (c-Si) PV have strong response. All the aforementioned materials have high transmittance in the visible (see FIGS. 4A, 4C and 4D) and refractive index within the as described range. Although, the glass is covered by the DS material the space in the middle where solar cells do not exist into the panel is completely transparent in the visible region of light as it can be seen in FIG. 5.

The rare earth element luminophores as DS materials could be from a variety of europium complexes for red light emission such as Europium or Samarium with thenoyl trifluoroacetone ligands, Europium or Samarium with phenanthroline ligands, Europium or Samarium with 2-(5, 6-diphenyl-1,2,4-triazin-3-yl) pyridine ligands, europium with 2-(1H-1,2,4-Triazol-3-yl) pyridine ligands or a combination of them. For green light emission a series of Terbium complexes can be used. As examples, Terbium with acetyl acetone ligands or Terbium with phenanthroline ligands or combination of them can be used. A series of other rarer earths such as Erbium, Praseodymium and Yttrium could alternatively be used in the form of complexes of previous ligands. For blue light emission a series of small organic molecules or polymeric materials, including but not limited to anthracene, carbazole, quinoline, methoxyquinoline, benzo[h]quinoline, quinine, quinidine, acridine, fluorene and more complex organic compounds or polymeric materials based on the above structures.

The application of these compounds on glass or alternatively on the silicon PVs before installation to the panel can be made by inkjet printing of special inks with high coverage and uniformity besides high consumption of the materials taking the advantage of the inkjet printing technology. In a c-Si PV panel special designed for greenhouse applications, the part of the glass that faces the solar cells is covered with luminescent compound so that after UV illumination (part of solar light) strongly emits red light efficiently captured by the solar cells. The UV light which is not productive and in some cases is detrimental to the long time operation of the solar cells is efficiently absorbed by the same luminescent compound. FIG. 3B shows that the area among the solar cells is also covered by the luminescent compound as the specific emission in the red region of solar light could be efficiently used to the photosynthesis of the plants when these panels are installed to the shell of a greenhouse.

A typical example of nano-coating formation for red light shifting using inkjet printing method is the following:

The ink is used for printing process may contain but not exclusively 10 ml of isopropanol and 0.02-0.04 grams of Europium Chloride or Europium Nitrate or any other Europium salt. Besides 0.056-0.112 grams of thenoyl trifluoroacetone or any other diketonate could be present. 0.015-0.030 grams of Phenathroline, or other ligands such as 2-(5,6-diphenyl-1,2,4-triazin-3-yl) pyridine or 2-(1H-1,2,4-Triazol-3-yl) pyridine or other pyridine ligands could also be used. Instead, or in addition to the pyridine ligands, an analogous amount of amine such as methylamine, propylamine, 2,2,2-Trifluoroethylamine, Oleylamine, or other primary amine could be used. A combination of the above-mentioned materials could also be used. The solution pH must be adjusted to mildly acidic, or mildly basic by the addition of an appropriate amount of AcOH 1M or NaOH 1M. In order to covalently link the complex to the glass matrix one or more functionalized Silicon-based materials, such as Tetraethyl orthosilicate, 3-Cyanopropyltriethoxysilane, (3-Aminopropyl)triethoxysilane, 3-(Triethoxysilyl)propyl isocyanate, or other can also be used. In this case, the Silicon-based material/Europium salt molecular ratio is varied between 3/1 and 10/1. Finally, a polymer matrix is used to host the luminescent material with a polymer/material weight ratio varied between 0.5/1 and 50/1. The polymeric host could be poly(methyl methacrylate) (PMMA), poly(vinyl difluoride) (PVDF), poly(vinylpolypyrrolidone) (PVP), polystyrene (PS), polyvinyl-butyral (PVB) or copolymers of the above.

A typical example of nano-coating formation for green light shifting using inkjet printing method is the following:

The ink is used for printing process may contain but not exclusively 10 ml of isopropanol and 0.02-0.04 grams of Terbium Chloride or Terbium Nitrate or any other Terbium salt. Besides 0.056-0.112 grams of acetyl acetone or any other diketonate could be present. 0.015-0.030 grams of Phenathroline, or other ligands such as 2-(5,6-diphenyl-1,2, 4-triazin-3-yl) pyridine or 2-(1H-1,2,4-Triazol-3-yl) pyridine or other pyridine ligands could also be used. Instead, or in addition to the pyridine ligands, an analogous amount of amine such as methylamine, propylamine, 2,2,2-Trifluoroethylamine, Oleylamine, or another primary amine could be used. A combination of the above-mentioned materials could also be used. The solution pH must be adjusted to mildly acidic, or mildly basic by the addition of an appropriate amount of AcOH 1M or NaOH 1M. In order to covalently link the complex to the glass matrix one or more functionalized Silicon-based materials, such as Tetraethyl orthosilicate, 3-Cyanopropyltriethoxysilane, (3-Aminopropyl)triethoxysilane, 3-(Triethoxysilyl)propyl isocyanate, or other can also be used. In this case, the Silicon-based material/Terbium salt molecular ratio is varied between 3/1 and 10/1. Finally, a polymer matrix is used to host the luminescent material with a polymer/material weight ratio varied between 0.5/1 and 50/1. The polymeric host could be poly(methyl methacrylate) (PMMA), poly(vinyl difluoride) (PVDF), poly(vinylpolypyrrolidone) (PVP), polystyrene (PS), polyvinyl-butyral (PVB) or copolymers of the above.

A typical example of nano-coating formation for blue light shifting using inkjet printing method is the following:

The ink is used for printing process may contain but not exclusively 10 ml of Dimethylformamide and 0.02-0.10 grams of anthracene, carbazole, quinoline, methoxyquinoline, benzo[h]quinoline, quinine, quinidine, acridine, fluorene or different organic compounds or polymeric materials based on the above structures. The solution pH must be adjusted to mildly acidic, or mildly basic by the addition of an appropriate amount of AcOH 1M or NaOH 1M. In order to covalently link the compound to the glass matrix one or more functionalized Silicon-based materials, such as Tetraethyl orthosilicate, 3-Cyanopropyltriethoxysilane, (3-Aminopropyl)triethoxysilane, 3-(Triethoxysilyl)propyl isocyanate, or other can also be used. In this case, the Silicon-based material/organic compound molecular ratio is varied between 3/1 and 10/1. Finally, a polymer matrix is used to host the luminescent material with a polymer/material weight ratio varied between 0.5/1 and 50/1. The polymeric host could be poly(methyl methacrylate) (PMMA), poly (vinyl difluoride) (PVDF), poly(vinylpolypyrrolidone) (PVP), polystyrene (PS), polyvinyl-butyral (PVB) or copolymers of the above. If a luminescent polymeric material, based on the previously described structures is used, no other polymer matrix is used.

The inkjet printing station may include a drop-on-demand (DOD) piezoelectric inkjet nozzle head with 16 or more nozzles, depending on the printer, spaced at about 254 microns with typical drop sizes of between 1 and 10 picoliters. The print head preferably is mounted onto a computer-controlled three-axis system capable of movement accuracy of 5 μm.

For printing of europium ink, as an example, the substrate temperature ($T_{sub}$) set at 25° C., while the temperature of the cartridge ($T_{head}$) may be set at about 30° C. The Cartridge Print Height ($h_{cart}$), which is the gap between the nozzle and the printed surfaces, may be about 0.6 mm or more during printing depending on the material. The ejection of the droplets may be performed using 16 to 128 nozzles by applying a firing voltage of 15 to 18 volts for an impulse having an overall pulse duration lasting at about 15 μs, at a jetting frequency of about 10 kHz. Optimal film uniformity may be achieved by printing at dot-to-dot spacing of 5-10 μm, known as drop spacing. Exemplary parameters followed for other inkjet printed materials appear in Table 1. Analogous parameters are followed for the inks that are used for green or blue light shifting.

Table 1: Exemplary printing parameters for Europium based ink.

Width of waveform (μs): 15.296
Maximum Jetting Frequency (kHz): 10
Firing voltage (V): 16

Meniscus Vacuum (inches H$_2$O): 3
Cartridge Temperature (° C.): 30
Cartridge Height (mm): 0.600
Substrate Temperature (° C.): 25

Figure 6A:
FIGS. 6A and 6B show pictures of glass panels covered with DS red light emitting nano-coating while excited by solar light.
Figure 6B:
Figure 6C:
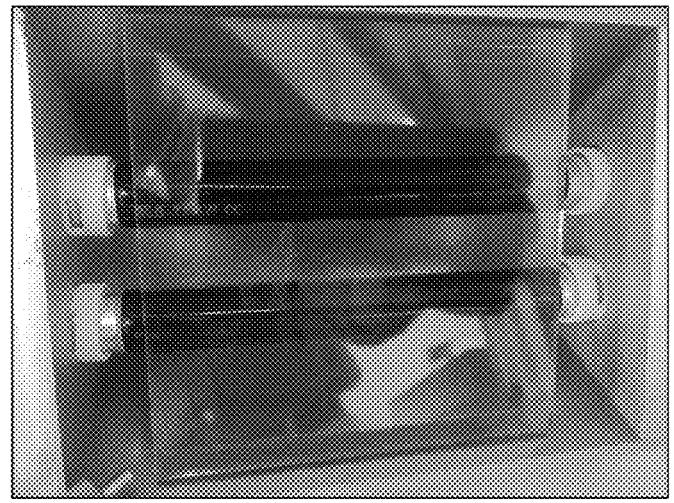
FIGS. 6C and 6D show pictures of glass panels covered with DS red light emitting nano-coating while excited by UV light from UV lamps.
Figure 6D:
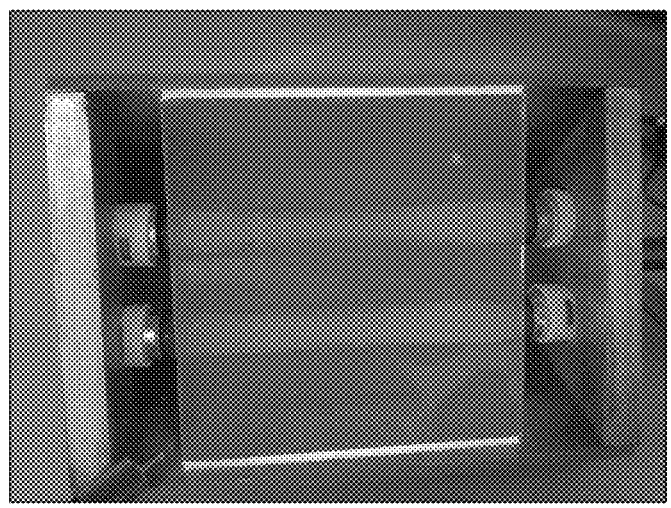

The emission of proposed rare earth complexes and organic molecules as nano-coatings on glass is very strong in the visible region of light by absorbing UV light. A typical example for red emitting light can be seen in FIG. 6. Either by absorbing natural solar light (FIGS. 6A and 6B) or UV light (FIGS. 6C and 6D) the emitting light is very strong. The nano-coatings may exist in the whole area of the solar panel on the inner side of the glass either in contact with solar cells or not. The increase to the solar cell performance by the presence of nano-coating can be varied from 2-10% and the PAR from 1-3% depending on the kind of the nano-coating.

Further, the present disclosure comprises the following enumerated clauses, which define exemplary embodiments of the present invention:

A photovoltaic glass pane includes a glass panel, one or more photovoltaic cells arranged on or in the glass panel, each of the one or more photovoltaic cells having a light receiving surface to be exposed to light from a light source and being comprised of a semiconducting material having a spectral response to the light, and a spectral conversion layer arranged between the light receiving surface and the light source and configured to convert photons from the light source of a first energy into photons of a second energy, wherein the spectral response to the photons of the second energy is higher than the spectral response to the photons of the first energy.

The spectral conversion layer is a luminescent down-shifting layer configured to convert the photons of the first energy into the photons of the second energy, wherein the first energy is higher than the second energy.

The photons of the first energy are photons having wavelengths in the UV part of the light spectrum and wherein the photons of the second energy are photons having wavelengths in the visible part of the light spectrum.

The luminescent down-shifting layer is made of a material comprising a compound of one or more rare earth elements.

The one or more rare earth elements comprise Europium or Samarium, and wherein the photons of the second energy are red light photons.

The one or more rare earth elements comprise Terbium, and wherein the photons of the second energy are green light photons.

The luminescent down-shifting layer is made of a material comprising organic molecules or polymeric materials based on aromatic compounds, and wherein the photons of the second energy are blue light photons.

The spectral conversion layer is arranged on top of the light receiving surface of each of the one or more photovoltaic cells and/or a surface of the glass panel between the light receiving surface and the light source.

The spectral conversion layer is arranged between the light receiving surface and the glass panel.

The spectral conversion layer is arranged on top of a light receiving surface of the glass panel that faces the light source.

The spectral conversion layer is arranged across the whole surface of the glass panel.

The spectral conversion layer is a nano-coating.

A method of manufacturing a photovoltaic glass pane includes providing a glass panel, arranging one or more photovoltaic cells on or in the glass panel, each of the one or more photovoltaic cells having a light receiving surface to be exposed to light from a light source and being comprised of a semiconducting material having a spectral response to the light, arranging a spectral conversion layer between the light receiving surface and the light source which is configured to convert photons from the light source of a first energy into photons of a second energy, wherein the spectral response to the photons of the second energy is higher than the spectral response to the photons of the first energy.

The spectral conversion layer is a nano-coating and wherein the step of arranging the spectral conversion layer between the light receiving surface and the light source comprises printing the nano-coating on the light receiving surface and/or a surface of the glass panel between the light receiving surface and the light source.

The nano-coating is printed such that it is arranged between the light receiving surface and the glass panel.

The nano-coating is printed on top of a light receiving surface of the glass panel that faces the light source.

The nano-coating is printed across the whole surface of the glass panel.

The step of printing the nano-coating comprises inkjet printing the nano-coating.

The spectral conversion layer is a luminescent down-shifting layer configured to convert the photons of the first energy into the photons of the second energy, wherein the first energy is higher than the second energy.

The photons of the first energy are photons having wavelengths in the UV part of the light spectrum and wherein the photons of the second energy are photons having wavelengths in the visible part of the light spectrum.

The luminescent down-shifting layer is made of a material comprising a compound of one or more rare earth elements.

The one or more rare earth elements comprise Europium or Samarium, and wherein the photons of the second energy are red light photons.

The one or more rare earth elements comprise Terbium, and wherein the photons of the second energy are green light photons.

The luminescent down-shifting layer is made of a material comprising organic molecules or polymeric materials based on aromatic compounds, and wherein the photons of the second energy are blue light photons.

The foregoing description discloses exemplary embodiments of the invention. While the invention herein disclosed has been described by means of specific embodiments and applications thereof, numerous modifications and variations could be made there to by those skilled in the art without departing from the scope of the invention set forth in the claims. Modifications of the above disclosed apparatus and methods that fall within the scope of the invention will be readily apparent to those of ordinary skill in the art. Accordingly, other embodiments may fall within the spirit and scope of the invention, as defined by the following claims.

In the description above, numerous specific details are set forth in order to provide a more thorough understanding of embodiments of the invention. It will be apparent, however, to an artisan of ordinary skill that the invention may be practiced without incorporating all aspects of the specific details described herein. In other instances, specific details well known to those of ordinary skill in the art have not been described in detail so as not to obscure the invention. Although examples of the invention are set forth herein, the claims, and the full scope of any equivalents, define the metes and bounds of the invention.

The invention claimed is:

1. A transparent photovoltaic glass pane, comprising:
a transparent glass panel;

one or more photovoltaic cells arranged on or in the transparent glass panel, each of the one or more photovoltaic cells having a light receiving surface to be exposed to light from a light source and being comprised of a semiconducting material having a spectral response to the light; and a spectral conversion layer arranged between the light receiving surface and the light source and configured to convert photons from the light source of a first energy into photons of a second energy, wherein the spectral response to the photons of the second energy is higher than the spectral response to the photons of the first energy, and wherein the spectral conversion layer is a luminescent nano-coating printed on top of a surface of the transparent glass panel that faces the light source, said coating being printed by inkjet printing of an ink on top of said surface of the transparent glass panel, wherein the ink comprises a europium salt and a diketone compound in an inorganic polymer matrix of a silane derivative, wherein the inorganic polymer matrix comprises (aminopropyl)triethoxysilane and 3-(triethoxysilyl)propyl isocyanate hosting a europium-thenoyl trifluoroacetone complex.

2. The transparent photovoltaic glass pane according to claim 1, wherein the spectral conversion layer is a luminescent down-shifting layer configured to convert the photons of the first energy into the photons of the second energy, wherein the first energy is higher than the second energy.

3. The transparent photovoltaic glass pane according to claim 2, wherein the photons of the first energy are photons having wavelengths in the UV part of the light spectrum and wherein the photons of the second energy are photons having wavelengths in the visible part of the light spectrum.

4. The transparent photovoltaic glass pane according to claim 1, wherein the spectral conversion layer is arranged across the whole surface of the glass panel.

5. A method of manufacturing a transparent photovoltaic glass pane, comprising;

providing a transparent glass panel;

arranging one or more photovoltaic cells on or in the transparent glass panel, each of the one or more photovoltaic cells having a light receiving surface to be exposed to light from a light source and being comprised of a semiconducting material having a spectral response to the light; and arranging a spectral conversion layer between the light receiving surface and the light source which is configured to convert photons from the light source of a first energy into photons of a second energy, wherein the spectral response to the photons of the second energy is higher than the spectral response to the photons of the first energy, wherein the step of arranging the spectral conversion layer between the light receiving surface and the light source comprises printing a luminescent nano-coating on the surface of the transparent glass panel that faces the light source by inkjet printing of an ink on top of said surface of the transparent glass panel, wherein the ink comprises a europium salt, and a diketone compound in an inorganic polymer matrix of a silane derivative, wherein the inorganic polymer matrix comprises (aminopropyl)triethoxysilane and 3-(triethoxysilyl)propyl isocyanate hosting a europium-thenoyl trifluoroacetone complex.

* * * * *